United States Patent [19]
McCollough et al.

[11] Patent Number: 5,903,748
[45] Date of Patent: May 11, 1999

[54] METHOD AND APPARATUS FOR MANAGING FAILURE OF A SYSTEM CLOCK IN A DATA PROCESSING SYSTEM

[75] Inventors: Kelvin E. McCollough; Javier Saldana; Pamela Daniel, all of Austin, Tex.

[73] Assignee: Motorola Inc., Austin, Tex.

[21] Appl. No.: 08/916,733

[22] Filed: Aug. 18, 1997

[51] Int. Cl.[6] .................................................. G06F 1/04
[52] U.S. Cl. ................................... 395/558; 395/184.01
[58] Field of Search .................................... 395/558, 559, 395/560, 181, 183.1, 183.13, 183.16, 184.01, 185.01, 185.08

[56] References Cited

U.S. PATENT DOCUMENTS

| | | | |
|---|---|---|---|
| 4,651,277 | 3/1987 | Sakaji | 711/167 |
| 4,691,126 | 9/1987 | Splett et al. | 327/526 |
| 4,931,748 | 6/1990 | McDermott et al. | 331/1 A |
| 4,982,116 | 1/1991 | Lee | 327/144 |
| 5,161,175 | 11/1992 | Parker et al. | 377/70 |
| 5,561,390 | 10/1996 | Hiiragizawa | 327/147 |

*Primary Examiner*—Thomas M. Heckler
*Attorney, Agent, or Firm*—Daniel D. Hill

[57] ABSTRACT

Under software control, a loss of clock detect circuit (24) can be enabled to detect loss of clock. A plurality of different clock signals, including the input reference clock (34) to the PLL (12) and the feedback (36) from the PLL (12), are monitored by the loss of clock circuit (24). When the currently selected system clock (38) signal is lost, a control circuit (28) can select an optimal back-up clocking mode based on which clock signals were lost. One such selectable mode is to utilize the input reference clock (34) directly instead of the PLL (12). Another such selectable mode is to utilize the PLL (12) in a self-clocked mode to provide the system clock (38).

19 Claims, 3 Drawing Sheets

METHOD AND APPARATUS FOR MANAGING FAILURE OF A SYSTEM CLOCK IN A DATA PROCESSING SYSTEM

FIELD OF THE INVENTION

The present invention generally relates to integrated circuits, and more specifically to monitoring system clock sources and dynamically selecting a backup system clock source upon detection of system clock failure.

BACKGROUND OF THE INVENTION

System clocks are necessary for the operation of microprocessors and microcontrollers. In many instances, loss of a system clock causes the microcontroller or microprocessor to stop. However, this is not acceptable or practical in certain situations. In particular, in control applications where a microcontroller is being used to govern the operation of a system, it is often essential that the system continues to operate so that it can go to a known state despite a loss of clock. One example of this is in an automotive engine controller, where an engine must be allowed to continue to operate even if the primary clock is lost.

As noted, the most basic answer to a loss of system clock is to take no further action, stopping of the microprocessor or microcontroller, and leaving the system nonoperational. One solution for keeping the microprocessor/ microcontroller operating after losing the system clock is to monitor the output of the system clock and to switch to a free-running RC oscillator upon loss of the system clock. This approach has several problems. One problem is that such a free-running RC oscillator requires increased chip area, consumes more power, and adds complexity. Another problem is that it is hard to control the frequency of such RC oscillators due to manufacturing process variations. With this solution, it is also impossible to distinguish between actual external reference clock failure and failure of the phase locked loop (PLL).

Another solution is to monitor the PLL's reference clock but not to alter the source of the system clock upon a reference failure. Instead, the voltage controlled oscillator (VCO) of the PLL is driven by a relatively constant voltage, which produces a fixed output frequency from the PLL, when the system clock is lost. One problem with this approach is that only one clock source is actually being monitored. Thus, it is impossible to determine whether or not the failure was in the reference clock or in the PLL itself. Also, if the PLL is the source which is not operational, then the system itself remains nonoperational.

BRIEF DESCRIPTION OF THE DRAWINGS

The features and advantages of the present invention will be more clearly understood from the following detailed description taken in conjunction with the accompanying FIGS. where like numerals refer to like and corresponding parts and in which.

DETAILED DESCRIPTION

Under software control, a loss of clock detect circuit can be enabled to detect a loss of clock. A plurality of different clock signals are monitored by the loss of clock circuit. In particular, the input reference clock to the PLL as well as the feedback from the PLL are monitored. When either signal is lost, a control circuit can select the optimal back-up clocking mode based on which clock signals have been lost. One such mode is to utilize the reference clock directly. Another such mode is to utilize the PLL in self-clocked mode to provide the system clock.

Figure 1:
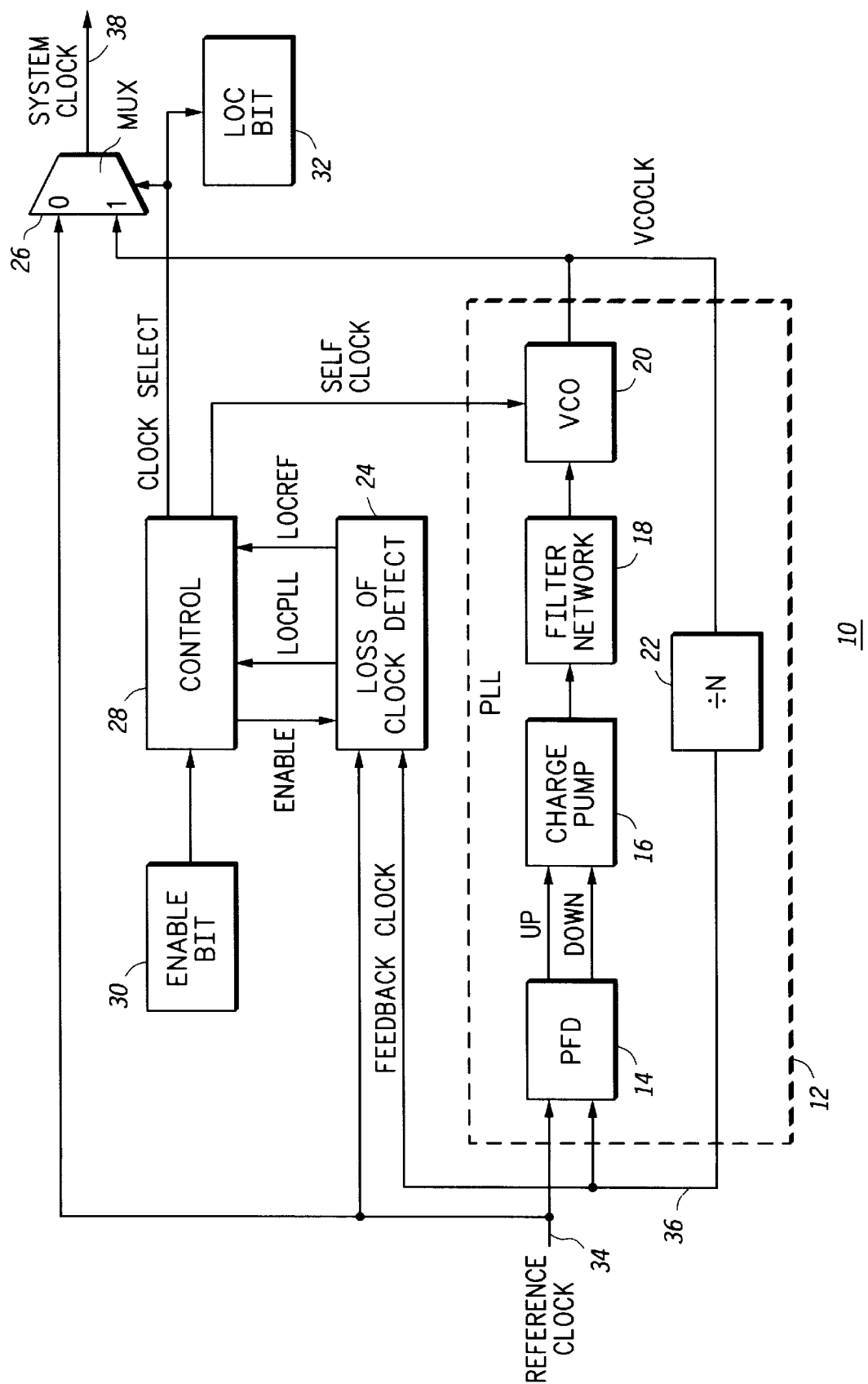
FIG. 1 is a block diagram illustrating a loss of clock monitor system for monitoring a plurality of clocks, in accordance with the present invention.

FIG. 1 is a block diagram illustrating a system 10 where two clocks are being monitored. The system 10 has an input reference clock 34 that is received by a Phase Locked Loop (PLL) 12. The reference clock 34 may be generated on the same integrated circuit (IC) as that containing the system 10 or may be provided by an external source. The PLL 12 consists of a phase frequency detector (PFD) circuit 14 that provides up and down signals to a charge pump 16, which generates output to a filter network 18, which in turn provides output to a voltage controlled oscillator (VCO) 20. Note that the voltage controlled functionality of the VCO 20 can be optionally replaced by an equivalent current controlled oscillator. In the preferred embodiment, the VCO 20 operates in voltage controlled mode in the synthesis mode, and in current controlled mode while in self-clocked mode. Providing feedback 36 to the PLL 12 is an N frequency divider 22 that receives the output from the VCO 20 and allows it to be adjusted to be a multiple of the reference clock 34. The output of the PLL 12 is received as one of a plurality of inputs by a multiplexer (mux) 26. The output of multiplexer 26 is the system clock 38.

A loss of clock detect circuit 24 receives the input reference clock 34, and the feedback signal 36 from the N frequency divider 22 in the PLL 12. When either or both of these clock signals is lost, the loss of clock detect circuit 24, if enabled, generates one or more loss of clock signals to a control circuit 28. The loss of system clock control circuit 28 is controlled by an enable bit 30 which if set enables the loss of clock control circuit 28 and the loss of clock detect circuit 24. The control circuit 28 generates a clock select signal that controls a multiplexer (mux) 26. In addition the control circuit 28 generates a signal to control the voltage controlled oscillator (VCO) 20 to put the VCO 20 in self-clocked mode when required. Finally, control circuit 28 generates a status bit 32 to indicate loss of clock.

The second signal to multiplexer 26 is the input reference clock 34. Thus, the control circuit 28 can select between the input reference clock 34 and the output from the PLL 12 for the system clock 38, and can selectively put the voltage controlled oscillator 20 in self-clocked mode.

Figure 2:
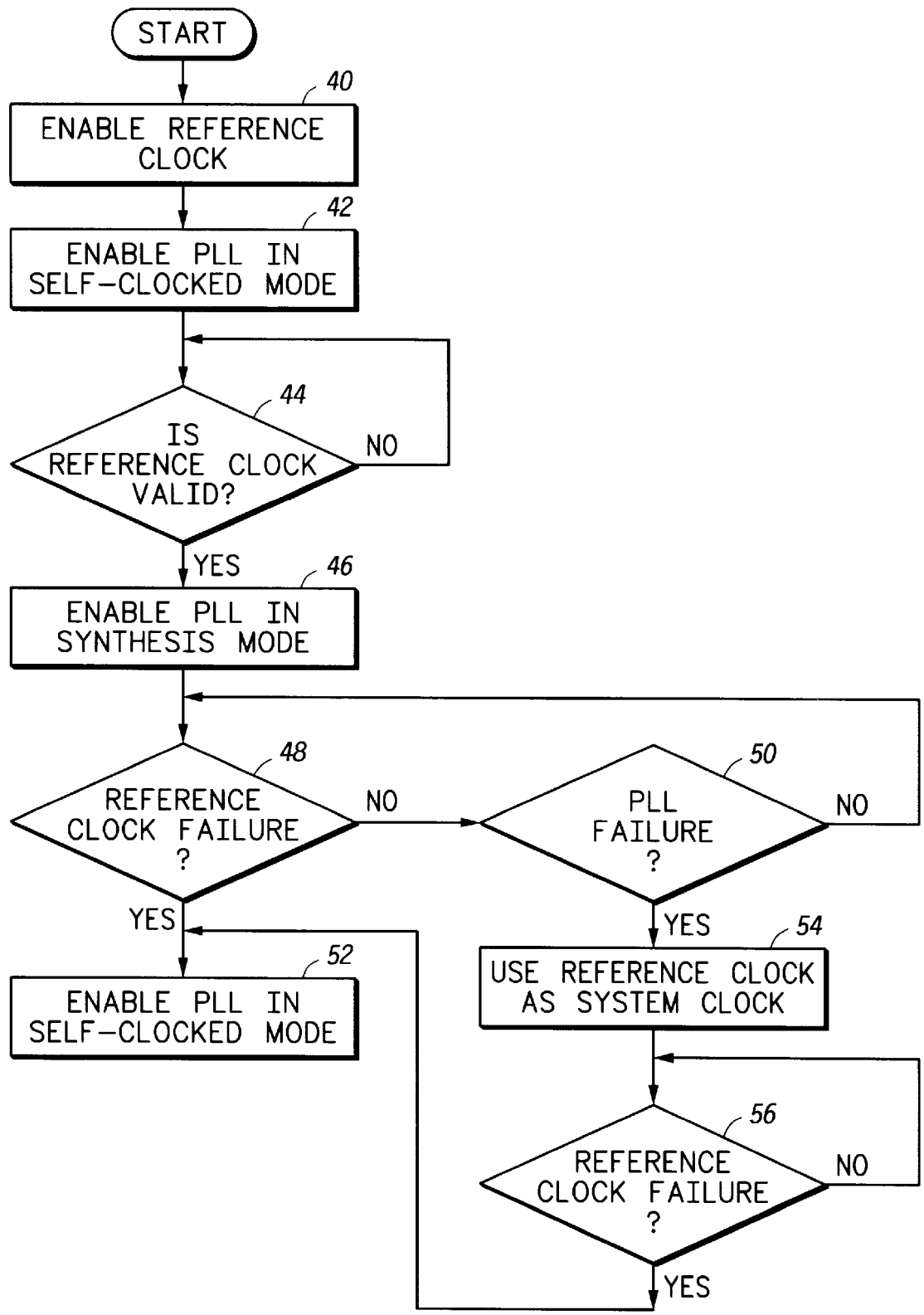
FIG. 2 is a flowchart illustrating operation of the loss of clock operation in FIG. 1.

FIG. 2 is a flowchart illustrating operation of the loss of clock system management system shown in FIG. 1. Upon power up the reference clock 34 is enabled, step 40. The PLL 12 is then enabled in self-clocked mode, step 42. A test is then made to check whether the reference clock 34 is valid, step 44. This test is repeated until the reference clock 34 does become valid, step 44. Passing this test means that the reference clock 34 is generating a frequency within a specified frequency range. Once the reference clock 34 is determined to be valid, step 44, the PLL 12 is enabled in synthesis mode, step 46. Synthesis mode is the normal operating mode of the PLL 12 wherein it generates a synthesized system clock 38 from a reference clock 34.

Once the PLL 12 is operating in synthesis mode, a test loop is entered. A test is made to check whether the reference clock 34 has failed, step 48. If the reference clock 34 has not failed, step 48, a test is made for PLL 12 failure, step 50. If there is no PLL 12 failure, step 50, the loop is repeated, again testing for reference clock 34 failure, step 48. Note that in this flowchart the reference clock 34 failure, step 48, and the PLL 12 failure, step 50, are shown in series, but in the preferred embodiment they are tested in parallel. If the reference clock 34 is determined to have failed, step 48, the PLL 12 is enabled in self-clocked mode, step 52. If the PLL 12 has been determined to have failed, step 50, the reference clock 34 is used as the system clock 38, step 54, by asserting the appropriate state of clock select input to multiplexer 26. The reference clock 34 is then tested, step 56, and as long as it is valid the reference clock 34 is used 'as the system clock 38, and the looping test of the reference clock 34, step 56, is repeated. If the reference clock 34 fails, step 56, the PLL 12 is placed in self-clocked mode, step 52 and multiplexer 26 is switched back to utilize the output from the PLL 12 as the system clock 38 source.

Note that if both the reference clock 34 and the PLL 12 fail or seem to have failed at the same time, the PLL 12 will be enabled in self-clocked mode and selected as the source of the system clock 38. This is to protect against incorrectly choosing the reference clock 34 as the system clock 38 input source when the PLL 12 is still functioning properly and the reference clock 34 is slowly failing. In this case, the PLL 12 would lock to zero (0) Hertz and a loss of clock would not be detected.

Figure 3:
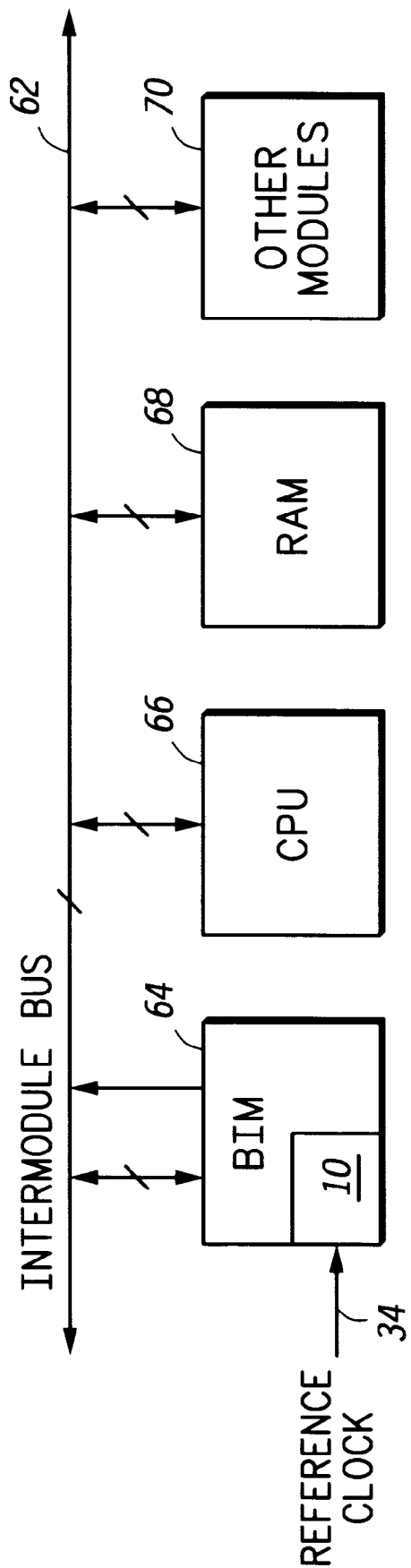
FIG. 3 is an example of a data processing system that includes the loss of clock monitor system shown in FIG. 1.

FIG. 3 is a data processing system 60 that includes the loss of system clock monitor system 10 shown in FIG. 1. The data processing system 60 has an intermodule bus (IMB) 62 that couples an integration module 64, a CPU 66, a RAM 68, and other modules 70. The integration module 64 includes the loss of system clock monitor system 10 and reference clock 34 shown in FIG. 1. The IMB is a traditional intermodule bus data processing system and is well known in the prior art. The various modules 64, 66, 68, and 70 in the data processing system 60 communicate with each other over the intermodule bus (IMB) 62.

A loss of clock monitoring system has been disclosed that monitors a plurality of clock signals and selects one of the plurality of clock signals when one or more clock signals are lost as the system clock 38. In the preferred embodiment, a reference frequency 34 can be selected if the PLL 12 fails, and the output from the PLL 12 in self-clocked mode can be selected if the reference frequency 34 fails. These capabilities provide significantly more modes of failure recovery than has been known in the prior art.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. An apparatus for managing a failure of a system clock signal in a data processing system, comprising:
    a terminal for receiving a reference clock signal;
    a phase locked loop circuit having a first input terminal for receiving the reference clock signal, a second input terminal for receiving a feedback signal, and an output terminal for providing an output signal, wherein the feedback signal is a function of the output signal, and during a normal mode of operation of the data processing system, the system clock signal being provided by the phase locked loop circuit; and
    a control circuit having a first input terminal for receiving the reference clock signal, a second input terminal for receiving the feedback signal, and in response to detecting a failure of reference clock signal, enabling the phase locked loop circuit to operate in a self-clocked mode to use the output signal as the system clock signal, and in response to detecting a failure of the feedback signal, providing the reference clock signal as the system clock signal.

2. The apparatus of claim 1, wherein the phase locked loop circuit comprises a controlled oscillator, and when the phase locked loop circuit is operating in the self-clocked mode, the control circuit provides a relatively constant reference to the controlled oscillator for causing the controlled oscillator to provide the output signal.

3. The apparatus of claim 1, wherein the control circuit comprises:
    a loss of clock detect logic circuit for monitoring the reference clock signal and the feedback signal, and providing a loss of reference clock signal if the reference clock signal fails, and providing a phase locked loop failure signal if the feedback signal fails;
    a control logic circuit for receiving the loss of reference clock signal and the phase locked loop failure signal and for providing a clock select signal; and
    a multiplexer having a first input terminal for receiving the reference clock signal and a second input terminal for receiving the output signal, an output terminal for providing the system clock signal, and a control terminal for receiving the clock select signal.

4. The apparatus of claim 3, further comprising a status bit field for displaying a logic state of the clock select signal.

5. The apparatus of claim 1, further comprising a programmable bit field for enabling the apparatus.

6. The apparatus of claim 1, wherein the reference clock signal is generated external to the data processing system.

7. The apparatus of claim 1, wherein the data processing system is characterized as being an integrated circuit microcontroller.

8. A data processing system, comprising:
    an input terminal for receiving a reference clock signal;
    a phase locked loop circuit comprising a controlled oscillator, the phase locked loop circuit having a first input terminal for receiving the reference clock signal, a second input terminal for receiving a feedback signal, and an output terminal for providing an output signal, wherein the feedback signal is a function of the output signal;
    a loss of clock detect logic circuit for monitoring the reference clock signal and the feedback signal, and providing a loss of reference clock signal if the reference clock signal fails, and providing a phase locked loop failure signal if the feedback signal fails;
    a control logic circuit for receiving the loss of reference clock signal and the phase locked loop failure signal, the control logic circuit for providing a clock select signal of a first logic state when the loss of clock detect logic circuit provides the loss of reference clock signal and the control logic circuit also providing the clock select signal of the first logic state during normal operation of the data processing system, and for providing the clock select signal of a second logic state when the loss of clock detect logic circuit provides the phase locked loop failure signal; and
    a multiplexer having a first input terminal for receiving the reference clock signal, a second input terminal for receiving the output signal, an output terminal for providing a system clock signal, and a control terminal for receiving the clock select signal;

wherein when the clock select signal is in the first logic state and the loss of reference clock signal is received, the control logic circuit providing a relatively constant reference to the controlled oscillator for causing the controlled oscillator to provide a relatively constant output signal, and the second input terminal of the multiplexer is directly coupled to the output terminal of the multiplexer for providing the output signal as the system clock signal.

9. The data processing system of claim 8, further comprising a programmable bit field for enabling the control logic circuit.

10. The data processing system of claim 8, further comprising a status bit field for displaying a logic state of the clock select signal.

11. The data processing system of claim 8, wherein the reference clock signal is generated external to the data processing system.

12. The data processing system of claim 8, wherein when the clock select signal is in the second logic state, the first input terminal of the multiplexer is directly coupled to the output terminal of the multiplexer for providing the reference clock signal as the system clock signal.

13. The data processing system of claim 8, wherein the data processing system is characterized as being an integrated circuit microcontroller.

14. A method for managing a failure of a system clock in a data processing system, comprising the steps of:

receiving an input clock signal;

enabling a phase locked loop to provide a first output signal and a second output signal using the input clock signal as a reference;

providing the first output signal for use as the system clock; setting a bit in a programmable bit field of the data processing system for enabling the data processing system to monitor the input clock signal and the second output signal;

determining that the input clock signal has failed;

enabling the phase locked loop to operate without use of the input clock signal to provide a relatively constant output signal; and providing the relatively constant output signal for use as the system clock.

15. The method of claim 14, further comprising the steps of:

determining that the second output signal has failed; and providing the input clock signal for use as the system clock.

16. The method of claim 15, further comprising the step of providing a status bit for monitoring which of the input clock signal or the first output signal is being used as the system clock.

17. The method of claim 14, wherein the second output signal is a feedback signal of the phase locked loop and the second output signal is a frequency divided first output signal.

18. The method of claim 14, further comprising the steps of:

determining that both the input clock signal and the second output signal have failed; and enabling the phase locked loop to operate without use of the input clock signal to provide a relatively constant output signal for use as the system clock.

19. The method of claim 14, wherein the step of receiving an input clock signal further comprises receiving the input clock signal from external to the data processing system.

* * * * *